US005376913A

United States Patent [19]

Pine et al.

[11] Patent Number: 5,376,913

[45] Date of Patent: Dec. 27, 1994

[54] VARIABLE RESISTOR UTILIZING AN ELASTOMERIC ACTUATOR

[75] Inventors: Jerrold Pine; Stefan Peana; Charles A. Hahs, Jr., all of Boca Raton, Fla.

[73] Assignee: Motorola, Inc., Schaumburg, Ill.

[21] Appl. No.: 89,364

[22] Filed: Jul. 12, 1993

[51] Int. Cl.[5] .......... H01L 43/00
[52] U.S. Cl. .......... 338/114
[58] Field of Search .......... 338/114, 99

[56] References Cited

U.S. PATENT DOCUMENTS

| | | | |
|---|---|---|---|
| 4,283,704 | 8/1981 | Ohtani et al. . | |
| 4,295,119 | 10/1981 | Kasashima et al. . | |
| 4,300,114 | 11/1981 | Sheridan et al. . | |
| 4,306,216 | 12/1981 | Azema et al. . | |
| 4,503,705 | 3/1985 | Polchaninoff | 338/114 X |
| 4,847,586 | 7/1989 | Tanaga et al. | 338/114 |
| 4,897,629 | 1/1990 | Lecklider | 338/114 X |
| 5,162,775 | 11/1992 | Kuramochi et al. | 338/114 |

*Primary Examiner*—Marvin M. Lateef
*Attorney, Agent, or Firm*—Kelly A. Gardner; John H. Moore

[57] ABSTRACT

A variable resistor (102) for varying a resistance between first and second terminals (145, 150) includes a substrate (200) having formed thereon a resistor network (205) for providing the resistance, wherein the resistor network (205) is electrically coupled between the first and second terminals (145, 150). The variable resistor (102) further includes an elastomeric actuator (300) having opposing upper and lower surfaces (310, 305), wherein the lower surface (305) is conductive. The lower surface (305) electrically couples the first terminal (145) to successive portions of the resistor network (205) as an increasing force is applied to the upper surface (310) of the elastomeric actuator (300), in response to which the resistance between the first and second terminals (145, 150) varies.

9 Claims, 6 Drawing Sheets

VARIABLE RESISTOR UTILIZING AN ELASTOMERIC ACTUATOR

FIELD OF THE INVENTION

This invention relates in general to resistive devices, and more resistors having varying resistances.

BACKGROUND OF THE INVENTION

Resistive devices are well known in the art. Resistors typically comprise a resistive material, such as a thick film resistor element or a resistive wire, to which terminations are attached for electrically coupling the resistor to other circuit elements. One type of resistor is a variable resistor for varying the resistance provided between the terminations. This variable resistance can be utilized in a number of applications, such as in volume controls for stereos and dimmers for lighting purposes.

Variable resistors are typically manufactured in a configuration in which a resistive element is terminated in at least one fixed terminal. A moveable terminal is attached to an actuator, such as a rotary knob, thumbwheel, or slideable member, such that the moveable terminal contacts different regions of the resistive element as a user manipulates the actuator. In this manner, the resistance between the fixed terminal and the moveable terminal varies as the actuator is manipulated.

More specifically, in one conventional variable resistor utilizing a thumbwheel, an insulating substrate is imprinted with a resistor network. The substrate and a cover form a housing containing the thumbwheel, terminals embedded in the cover, and conductors carried by the thumbwheel which selectively connect portions of the resistor circuit to the terminals such that the resistance between the terminals is determined by the thumbwheel position.

As can be seen from the above description, conventional variable resistors utilize a relatively large number of parts, e.g., actuator, cover, terminals, conductors, substrate, and resistor network. During manufacturing of the variable resistor, these parts must be cataloged, ordered, and stocked separately. Additionally, the parts must be assembled in labor intensive processes involving the use of fasteners such as screws, pins, or rivets for fastening the actuator to the terminals. Once the variable resistor is assembled, wear and tear can occur which can interrupt the operation of the resistor. For instance, in variable resistors having a terminal which slides across a resistive element, the resistive element and/or the terminal can become worn after repeated use. If the terminal is very small or fragile, as in smaller variable resistors, it can even break entirely from the forces applied thereto by the actuator and the resistive element.

Thus, what is needed is a variable resistor which includes a relatively small number of parts that can be easily assembled. Furthermore, parts included in the variable resistor should not become worn with repeated use.

SUMMARY OF THE INVENTION

A variable resistor for varying a resistance between first and second terminals includes a substrate having formed thereon a resistor network for providing the resistance, wherein the resistor network is electrically coupled between the first and second terminals. The variable resistor also includes an elastomeric actuator having opposing upper and lower surfaces, wherein the lower surface is conductive. The lower surface electrically couples the first terminal to successive portions of the resistor network as an increasing force is applied to the upper surface of the elastomeric actuator, in response to which the resistance between the first and second terminals varies. The elastomeric actuator also includes integral attachment means formed from the elastomeric material for securing the elastomeric actuator to the substrate. The lower surface comprises at least first, second, and third sub-surfaces electrically coupled together. The second sub-surface is formed at a first height with respect to the first sub-surface, and the third sub-surface is formed at a second height with respect to the second sub-surface such that, as the increasing force is applied to the upper surface of the elastomeric actuator, each of the first, second, and third sub-surfaces successively contacts the successive portions of the resistor network, in response to which the resistance between the first and second terminals varies incrementally.

BRIEF DESCRIPTION OF THE DRAWINGS

FIG. I is an electrical block diagram of an electronic device employing a variable resistor for volume control in accordance with the present invention.

DESCRIPTION OF A PREFERRED EMBODIMENT

Figure 1:
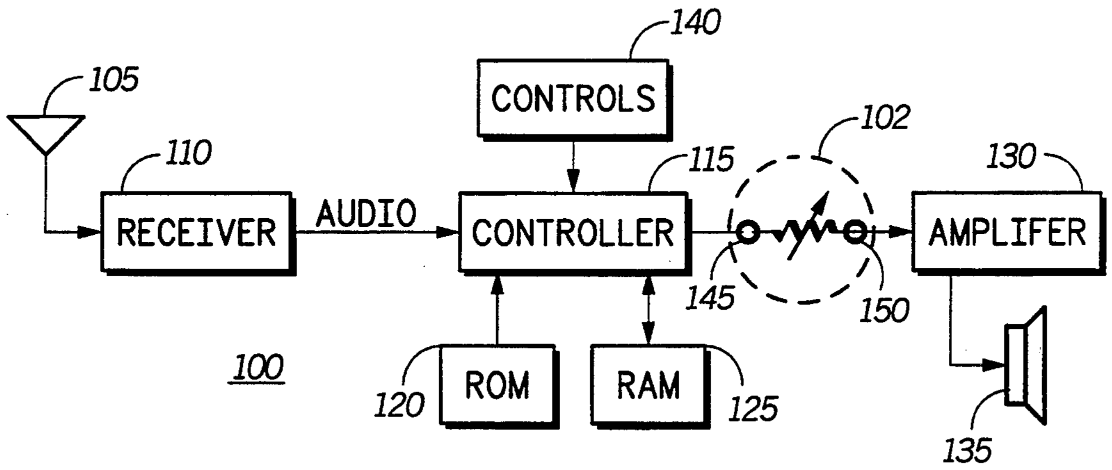

FIG. 1 is an electrical block diagram of an electronic device, such as a radio communication device 100, which utilizes a variable resistor in accordance with a preferred embodiment of the present invention. The radio communication device 100 preferably comprises an antenna 105 for receiving a radio frequency (RF) signal and a receiver 110 coupled to the antenna 105 for recovering an audio signal from the RF signal. The audio signal is provided to a controller 115, which controls the operation of the radio communication device 100 by executing subroutines stored in a read only memory (ROM) 120. Upon reception of the audio signal, which is representative of a voice message, the controller 115 converts the audio signal into digital data for storage in a random access memory (RAM) 125 and provides an activation signal to an audio amplifier 130. The audio amplifier 130 amplifies the signal for transmission to a transducer 135 coupled to the amplifier 130. The transducer 135, in a manner well known to one of ordinary skill in the art, translates the electrical signal from the amplifier 130 into an audible alert, having a predetermined volume level, which announces reception of an audio signal representative of a voice message.

The voice message can be either automatically presented by the transducer 135 or presented in response to user manipulation of controls 140 accessible to the user. In either situation, the digital data is retrieved from the RAM 125, converted into an audio signal, and provided by the controller 115 to the audio amplifier 130. The transducer 135 receives the amplified audio signal and generates therefrom the voice message which is presented to the user at the predetermined volume level.

Preferably, a variable resistor 102 is coupled between the controller 115 and the audio amplifier 130. The variable resistor 102 comprises a first terminal 145 coupled to the audio output of the controller 115 and a second terminal 150 coupled to the input of the amplifier 130. Additionally, the variable resistor 102 comprises an actuator (not shown), which is accessible to the user. The actuator, in response to an increasing force applied thereto by the user, varies the resistance between the first and second terminals 145, 150, thereby varying the current supplied to the audio amplifier 130 and the volume of the transducer 135. In this manner, the user can, during presentation of a voice message by the transducer 135, increase the volume at which the message is presented.

Figure 2:
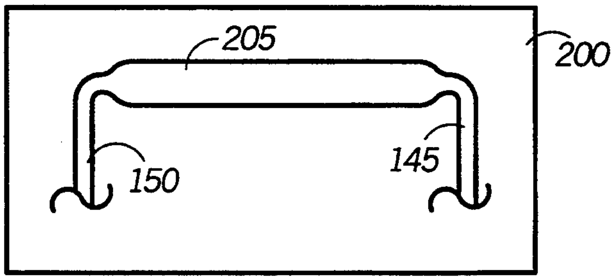
FIG. 2 is a top planar view of a substrate included in the variable resistor of FIG. 1 in accordance with the present invention.

FIGS. 2–6 illustrate the mechanical construction of the variable resistor 102 in accordance with the preferred embodiment of the present invention. FIG. 2 is a top view of a substrate 200, such as a printed circuit board, on which a portion of the variable resistor 102 (FIG. 1) is formed. If a printed circuit board is employed, the substrate 200 can be a glass epoxy material on which a thick or thin film resistive element is plated to form a resistor network 205 having a predetermined resistance. The resistor network 205, although shown as a straight runner of metallization, may be plated in any configuration. Additionally, runners, preferably formed from copper or another low resistance material, are plated on the substrate 200 at either end of the resistor network 205, thereby forming the first and second terminals 145, 150. Although not shown in FIG. 2, it will be appreciated that, depending upon the size of the substrate 200 and the construction of the radio communication device 200, other elements of the radio communication device 100, such as the receiver 110, the controller 115, the amplifier 130, etc., can be mounted on the substrate 200 and interconnected by runners plated thereon.

Figure 3:
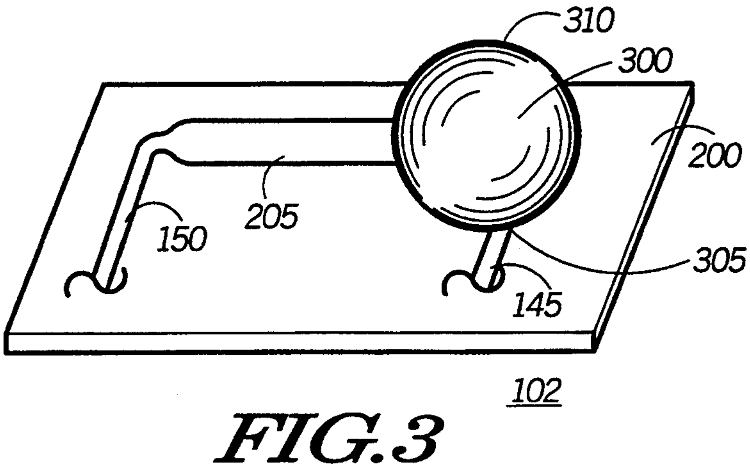
FIG. 3 is a perspective view of the substrate and an elastomeric actuator, in accordance with a preferred embodiment of the present invention, included in the variable resistor of FIG. 1.

Referring next to FIG. 3, an actuator 300 included in the variable resistor 102 is shown. According to the present invention, the actuator 300 is formed from an elastomeric material, such as rubber, and has at least one surface which is conductive. The conductive surface can be, for example, an elastomeric surface coated with conductive ink, such as a carbon ink, or plated with another low resistance material. In its simplest form, as shown, the actuator 300 is a molded rubber sphere coated with a conductive ink, although it will be appreciated that the actuator 300 can be molded into other shapes as well, as will be explained in greater detail below. The actuator 300 is mounted, in a manner to be described below, to the substrate 200 such that the lower surface 305 of the actuator 300 contacts a region in which the resistor network 205 and the first terminal 305 intersect. When the upper surface 310 of the actuator 300 is then pushed downwards by the user, the actuator 300 is compressed by the force exerted on the upper surface 310, thereby decreasing the resistance provided between the first and second terminals 145, 150.

Figure 4:
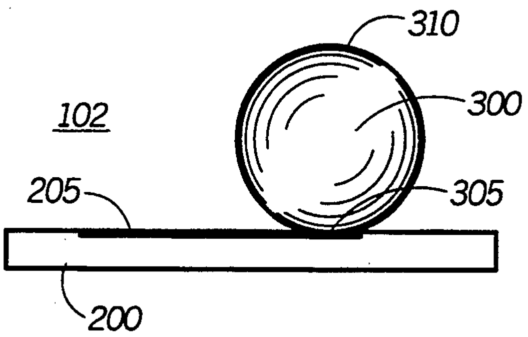
FIGS. 4–6 are side views of the variable resistor of FIG. 1 when a force is applied to the elastomeric actuator of FIG. 3 in accordance with a preferred embodiment of the present invention.
Figure 5:
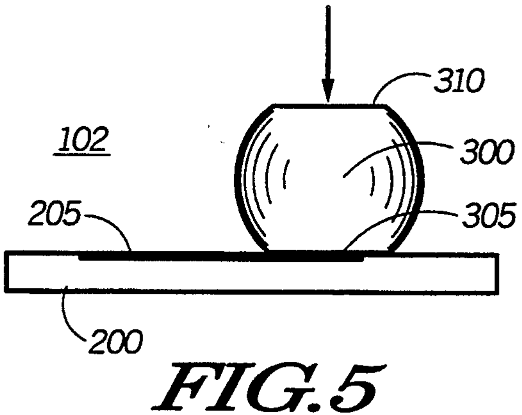
Figure 6:
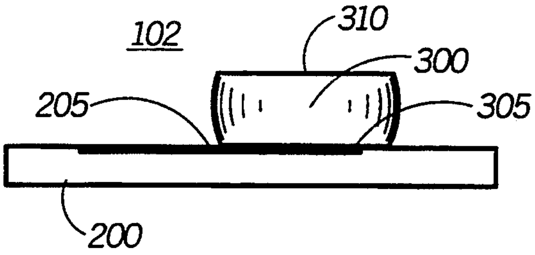

This process may be better understood by referring to FIGS. 4, 5, and 6, which are side views of the variable resistor 200 during application of an increasing force to the upper surface 310 of the elastomeric actuator 300. FIG. 4 shows the variable resistor 102 before application of a force to the actuator 300. In this situation, only a small portion of the resistor network 205 is contacted by the lower surface 305. When, as shown in FIG. 5, a downwards force is applied to the upper surface 310 of the actuator 300, the actuator 300 is compressed such that the lower surface 305 contacts a greater portion of the resistor network 205. Because, as mentioned above, the lower surface 305 is conductive, i.e., the actuator 300 is coated in a conductive ink, this greater portion of the resistor network 205 is "shorted". In other words, the first terminal 145 (FIG. 3) is coupled directly to the remaining portion of the resistor network 205 which is not contacted by the lower surface 305 of the actuator 300, thereby effectively decreasing the resistance between the first and second terminals 145, 150. When the force applied to the upper surface 310 of the actuator is increased, the actuator 300 is further compressed such that the lower surface 305 contacts an even greater portion of the resistor network 205, as shown in FIG. 5. During application of this increased force, the resistance provided between the first and second terminals 145, 150 decreases even further.

Figure 7:
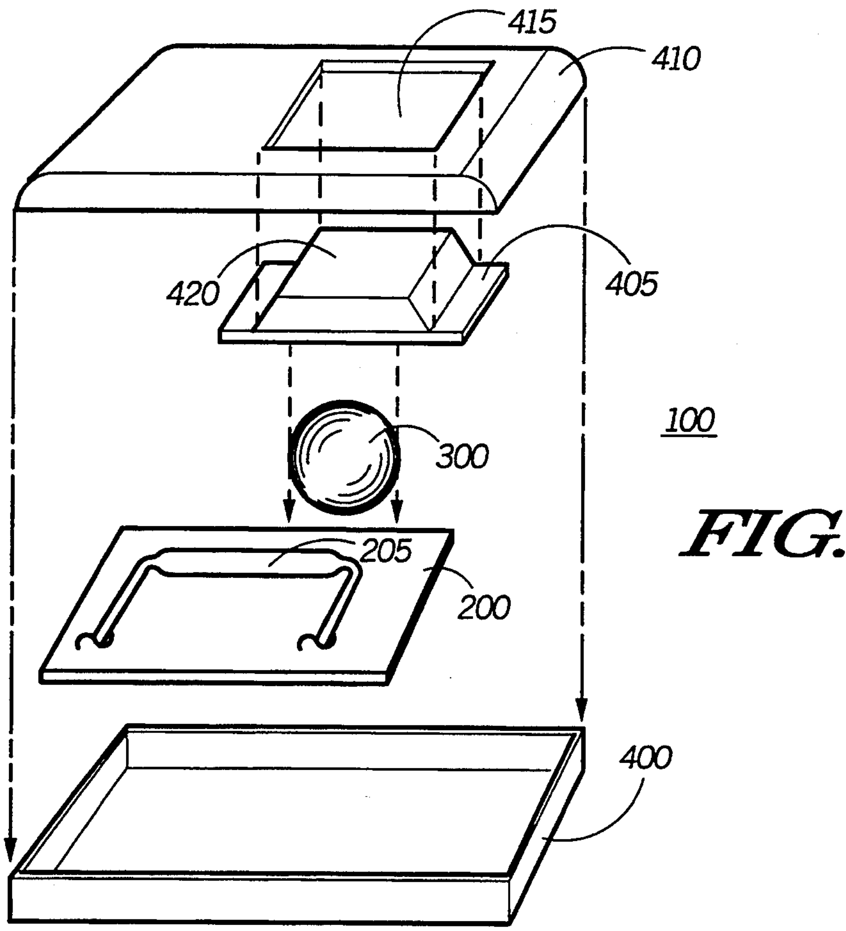
FIG. 7 is an exploded view of the electronic device of FIG. 1 including the elastomeric actuator of FIG. 3 in accordance with the preferred embodiment of the present invention.

Referring next to FIG. 7, an exploded view of the radio communication device 100 is shown. Preferably, during assembly of the radio communication device 100, the substrate 200, on which the resistor network 205 and the first and second terminals 145, 150 are formed, is situated within a lower housing element 400. As described above, other circuitry included within the radio communication device 100 can also be mounted to and formed on the substrate 200 in some instances. The elastomeric actuator 300 is mounted to the substrate 200 in the correct location wherein the resistor network 205 and the first terminal 145 are coupled, subsequent to which an insulative, elastomeric cover 405 is positioned over the actuator 300 to secure the actuator 300 to the substrate 200. The cover 405, which can be constructed in many configurations, is preferably formed such that it is small enough to prevent displacement of the actuator 300 within the radio communication device 100, yet large enough to allow for compression of the actuator 300. Thereafter, the first housing element 400 is latched to a second housing element 410, which has formed therein an opening 415 through which the upper region 420 of the cover 405 is accessible to a user.

Figure 8:
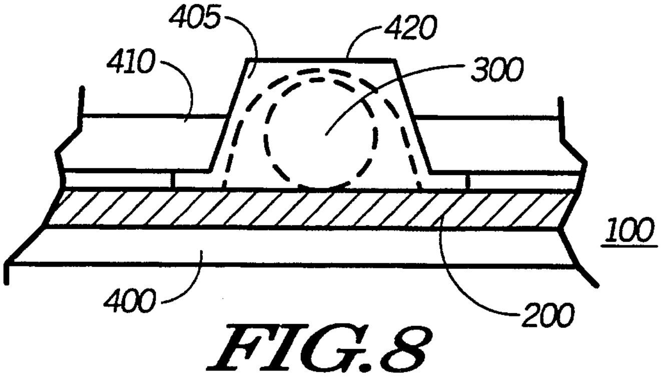
FIG. 8 is a side, cutaway view of the electronic device of FIG. 1 which includes the elastomeric actuator of FIG. 3 in accordance with the preferred embodiment of the present invention.

FIG. 8 is a side, cutaway view of the radio communication device 100. When, as shown, the radio communication device 100 is fully assembled, the upper region 420 of the cover 405 extends through the opening 415 (FIG. 7) formed in the second housing element 415 such that the user, by pressing on the upper region 420, exerts a downward pressure on the actuator 300 to compress the actuator 300 (FIGS. 5 and 6) and decrease the resistance between the first and second terminals 145, 150. When the user ceases to push on the upper region of 420 of the cover 405, the actuator 300 resumes its uncompressed shape, and the resistance between the first and second terminals 145, 150 increases to its original predetermined level.

Conventional variable resistors, unlike the variable resistor 102 described above, typically comprise a large number of parts and fasteners for securing the resistor. For example, one conventional variable resistor includes a substrate having a resistor network formed thereon. Separate terminals are embedded in a housing which secures the terminals to ends of the resistor network. A thumbwheel is fastened to the substrate in a correct location by a screw or a rivet allowing rotation of the thumbwheel, and conductors attached to the thumbwheel, such as by soldering, are rotated into contact with different portions of the resistor network. For utilization in circuit applications, the terminals must be electrically coupled, e.g., soldered, to appropriate circuit locations. This electrical coupling must often be performed in a manual process, as the plastic housing can be damaged by the high temperatures of a reflow oven.

The variable resistor 102 according to the present invention eliminates many of the problems associated with conventional variable resistors. For example, because the elastomeric actuator 300 is held in contact with the substrate 200 by the cover 405 and the housing element 410, labor intensive fasteners, such as screws and rivets, are not needed. Additionally, separate conductors, such as conductors used with a thumbwheel, are eliminated because the lower surface 305 of the actuator 300 is simply coated in conductive ink. When the resistor network 205 and the terminals 145, 150 are formed directly on a main printed circuit board to which other radio components are mounted, the variable resistor 102 can actually be implemented in a single part, i.e., the elastomeric actuator 300. It can be seen, therefore, that the variable resistor 102 can be implemented using fewer parts and using less labor intensive processes than conventional variable resistors. This results in fewer parts-related problems, e.g., ordering and inventory mistakes, and fewer assembly errors.

A further advantage of the present invention is that the variable resistor 102 is less fragile than conventional conductors. Conventionally, variable resistors include small terminals and switches which can easily break or wear. In wiper type variable resistors, for instance, a terminal which "wipes" across a resistor network can eventually erode the metallization of which the resistor network is formed, thereby rendering the variable resistor unreliable or inoperable. The variable resistor 102 according to the present invention conveniently eliminates this problem be utilizing a single part, i.e., a sturdy elastomeric actuator 300, which is not subject to breakage. Furthermore, because the variable resistor 102 does not include any parts which forcibly slide across the resistor network 205, the metallization included therein is not subject to wear during use of the variable resistor 102.

Figure 9:
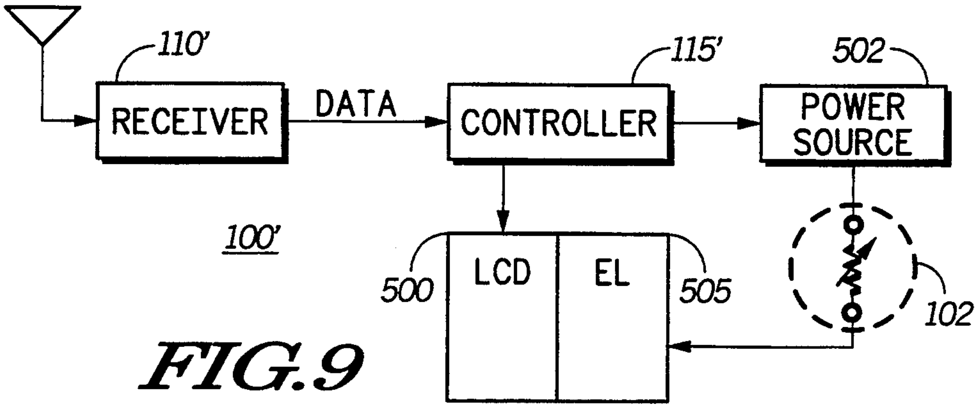
FIG. 9 is an electrical block diagram of an electronic device employing the variable resistor of FIG. 1 in a different application in accordance with the present invention.

As described above, the variable resistor 102 can be used as a volume control for the radio communication device 100. However, the variable resistor 102 can be used in many other applications as well. For example, referring to FIG. 9, the variable resistor 102 can be conveniently utilized in a radio communication device 100' for presenting a selective call message on a display device, such as a liquid crystal display (LCD) 500. Preferably, the radio communication device 100' comprises a receiver 110' which receives a selective call message and recovers therefrom digital data, which is provided to a controller 115'. The controller 115' then transforms the digital data into signals appropriate for addressing the LCD 500 and provides the signals to the LCD 500, thereby driving picture elements to visibly present the message to the user. Additionally, the controller 115' activates a power source 502, such as a conventional voltage controlled power source, to provide power to an electroluminescent (EL) panel 505 coupled to the power source 502 by the variable resistor 102. Preferably, in response to receiving power, the EL panel 505, which is mounted behind the LCD 500, emits light to illuminate the LCD 500 from behind. In situations in which a greater amount of illumination is desired by the user, such as when an area is relatively dark, the user can push down on the elastomeric actuator 300 (FIGS. 5 and 6) to decrease the resistance between the power source 502 and the EL panel 505, which, in response to the increased power supplied thereto, emits a greater amount of light.

In addition to the above-described applications, many other uses for the variable resistor 102 are envisioned. For example, the variable resistor 102 can be utilized to implement dynamic scrolling of messages across a display device or for deletion of stored messages. Additionally, the variable resistor 102 could be included in electronic devices other than radio devices. In vehicular applications, for instance, the variable resistor 102 according to the present invention could be utilized to lower electric windows or as an accelerator. It will be recognized by one of ordinary skill in the art that the variable resistor 102 can be utilized in any electronic device having a power source for providing power to the first terminal 145 of the variable resistor 102 and power sensing circuitry for sensing the power at the second terminal 150 and performing a predetermined action in response thereto.

In the above-described embodiment, the actuator 300 (FIG. 8) of the variable resistor 102 comprises elastomeric material molded into a sphere which is held to the substrate 200 by a cover 405 and a housing element 410. However, in some situations, it may be desirable to use the variable resistor 102 in stand-alone applications in which external parts are not available for holding a spherical actuator 300 to the substrate 200.

Figure 10:
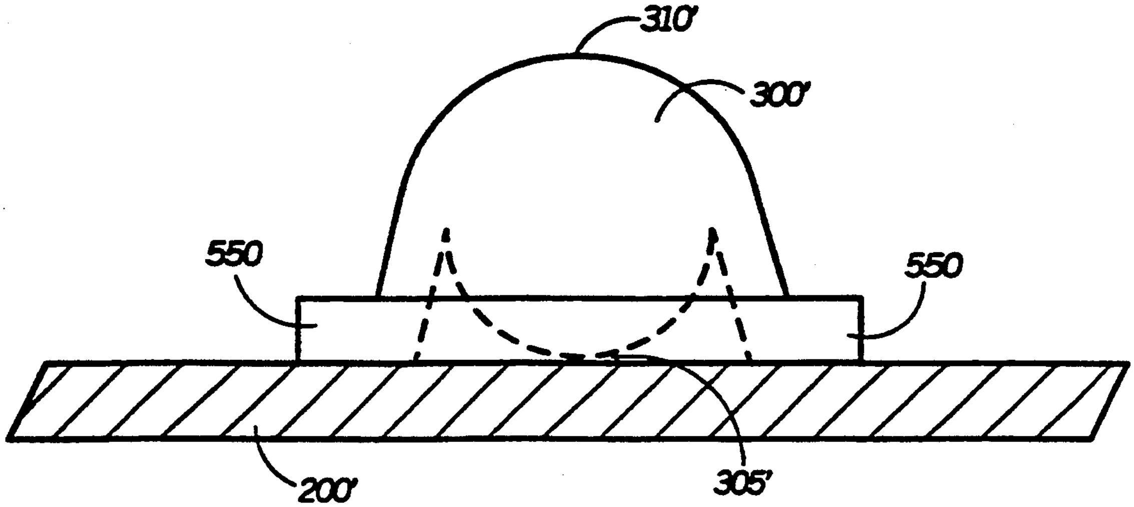
FIG. 10 is a side view of an elastomeric actuator, in accordance with a first alternate embodiment of the present invention, for use with the variable resistor of FIG. 1.
Figure 11:
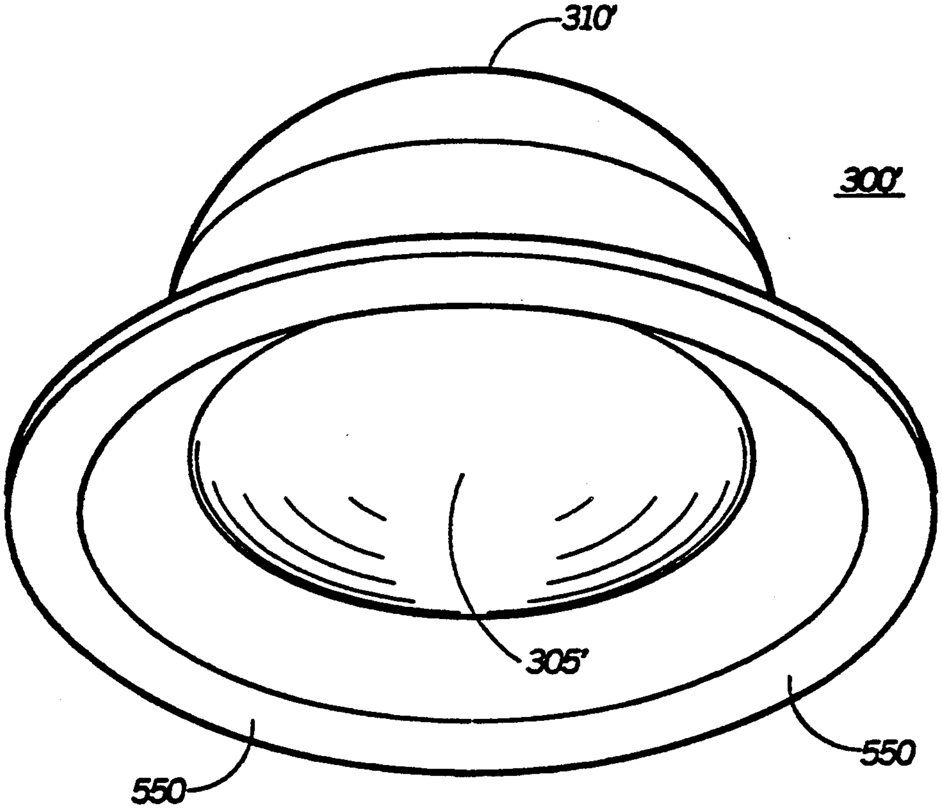
FIG. 11 is a perspective view of the elastomeric actuator of FIG. 10 in accordance with the first alternate embodiment of the present invention.

FIGS. 10 and 11 are side and perspective views, respectively, of an elastomeric actuator 300', in accordance with a first alternate embodiment of the present invention, which does not need external parts for securing to a substrate 200'. The elastomeric actuator 300' comprises a lower surface 305', preferably coated in a conductive ink, for contacting a resistor network (not shown) plated on the substrate 200'. The lower surface 305' is spherical and compresses, as in the above-described embodiment, when a downwards force is applied to an upper surface 310' of the actuator 300'. The actuator 300' further comprises an outer rim 550 which surrounds the lower surface 30540 and contacts the substrate 200' to support the actuator 300'. The actuator 300' can be conveniently secured to the substrate 200' by an adhesive (not shown) applied between the outer rim 550 and the substrate 200', therefore eliminating the need for external parts, such as a cover 405, for holding the actuator 300' in place. Additionally, similar to the elastomeric actuator 300 according to the preferred embodiment, the elastomeric actuator 300' can be easily constructed using conventional injection molding techniques.

Figure 12:
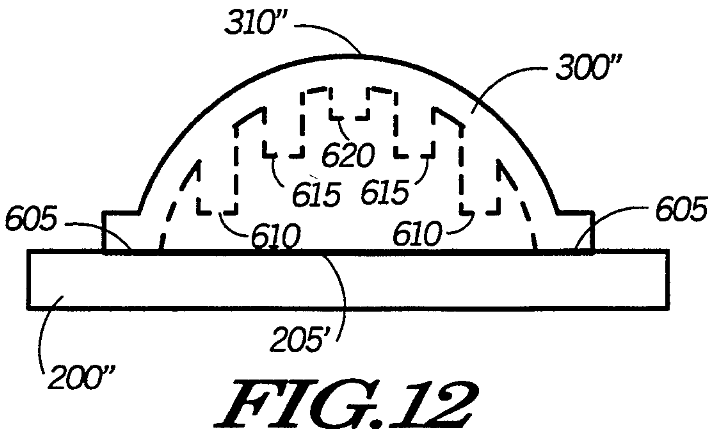
FIGS. 12–15 are side views of an elastomeric actuator, in accordance with a second alternate embodiment of the present invention, for use with the variable resistor of FIG. 1.
Figure 13:
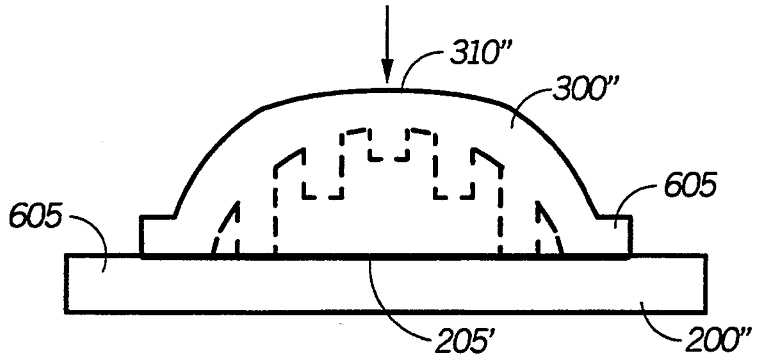
Figure 14:
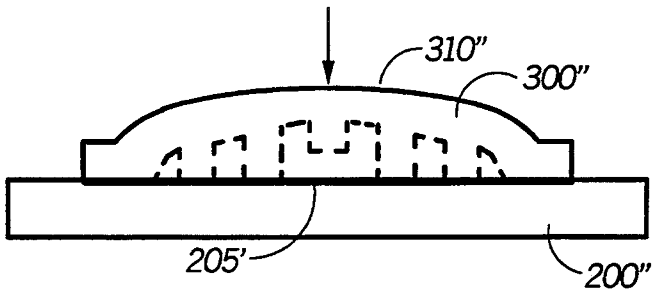
Figure 15:
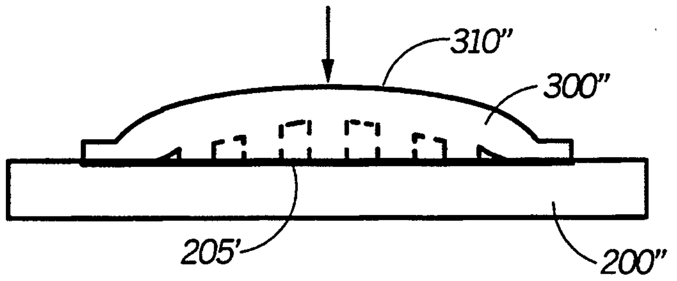

Referring next to FIGS. 12–15, side views of an elastomeric actuator 300" in accordance with a second alternate embodiment of the present invention are shown. The elastomeric actuator 300" comprises an upper surface 310" to which force is applied by a user and a lower surface having a plurality of sub-surfaces, all of which are electrically coupled, such as by a conductive ink screened thereon. One of the sub-surfaces, an outer sub-surface 605, supports the elastomeric actuator 300" on a substrate 200" and secures the actuator 300" thereto, preferably through use of an adhesive such as a conductive glue. A second sub-surface 610 is formed at a predetermined height with respect to the outer sub-surface 605, and a third sub-surface 615 is formed at the predetermined height with respect to the second sub-surface 610. A fourth sub-surface 620, which is formed in the center of the actuator 300", is similarly formed at the predetermined height with respect to the third sub-surface 615. As can be seen in FIG. 12, only the outer sub-surface 605 contacts a resistive network 205' formed on the substrate 200" when no force is applied to the upper surface 310" of the elastomeric actuator 300". As a result, the resistance provided by the resistor network 205', which is preferably formed on the substrate 200" beneath the actuator 300", is at its maximum value in this position. When, as shown in FIG. 13, a force is applied to the upper surface 310" of the actuator 300", the second sub-surface 610 is pushed into contact with the resistor network 205', thereby effectively decreasing the resistance of the resistor network 205' between the first and second terminals (not shown). FIGS. 14 and 15 show the elastomeric actuator 300" as increasing force is applied to the upper surface 310", thereby further decreasing the resistance. As can be seen in FIG. 15, when the fourth sub-surface 620 contacts the resistor network 205', the resistance between the first and second terminals is simply the resistance, i.e., approximately zero ohms, provided by the conductive ink which couples the sub-surfaces 605, 610, 615, 620.

Figure 16:
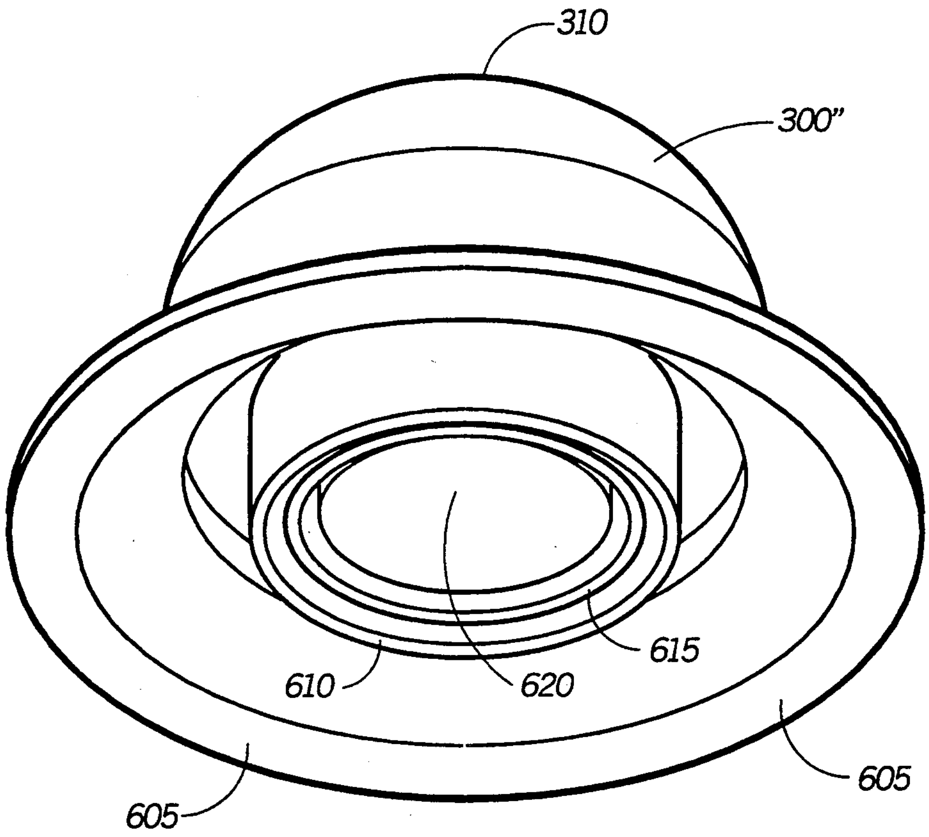
FIG. 16 is a perspective view of the elastomeric actuator of FIG. 12 in accordance with the second alternate embodiment of the present invention.

The actual construction of the elastomeric actuator 300" in accordance with the alternate embodiment of the present invention can be better understood by referring to FIG. 16, which is a perspective view øf the actuator 300" from beneath the lower surface. As shown, each of the sub-surfaces 605, 610, 615, 620 are in the shape of a conductive ring formed at a predetermined height relative to the previous sub-surface. In this manner, the elastomeric actuator 300" provides for an incremental decrease in resistance, whereas the elastomeric actuators 300, 300'(FIGS. 3 and 10) provide for a continuous decrease in resistance. It will be recognized by one of ordinary skill in the art that an elastomeric material can be molded into various other shapes and configurations, different from the configurations described above, to form other actuators which provide for either continuous or incremental decreases in resistance.

In summary, the variable resistor described above has several advantages over conventional variable resistors. The variable resistor according to the present invention, for instance, can be implemented utilizing only two parts, i.e., the elastomeric actuator and the substrate on which the resistor network and terminals are plated. In situations wherein the resistor network and the terminals can be plated onto a main printed circuit board, only an elastomeric actuator is necessary for implementation of the variable resistor. As a result, assembly of the variable resistor according to the present invention is both simpler and less expensive than assembly of conventional variable resistors, which can involve both the ordering and stocking of a large number of parts and the subsequent assembly thereof to form the conventional variable resistor.

Furthermore, as mentioned above, conventional variable resistors often employ "wiper" mechanisms for wiping across a plated resistor network to vary the resistance of the variable resistor. This wiping motion can easily erode the metallization of the resistor network, thereby causing unreliable operation of the variable resistor. Additionally, the wiper mechanism sometimes comprises only a thin, fragile element that can break after repeated use. Unlike conventional variable resistors, the variable resistor according to the present invention has no easily breakable parts and is therefore more reliable. Although the variable resistor described above utilizes a plated resistor network, the elastomeric actuator is employed to change the resistance provided by the resistor network through use of a downwards, rather than a sliding, motion. Furthermore, the elastomeric actuator, which is preferably a simple spherically shaped element, is not as easily damaged as conventional wiper elements.

It may be appreciated by now that there has been provided a variable resistor which includes a relatively small number of parts that will not become worn with repeated use.

What is claimed is:

1. A variable resistor for varying a resistance between first and second terminals, comprising:

a substrate having formed thereon a resistor network for providing the resistance, wherein the resistor network is electrically coupled between the first and second terminals;

an elastomeric actuator having opposing upper and lower surfaces, wherein the lower surface is conductive, and wherein the lower surface electrically couples the first terminal to successive portions of the resistor network as an increasing force is applied to the upper surface of the elastomeric actuator, in response to which the resistance between the first and second terminals varies, wherein the elastomeric actuator further includes integral attachment means formed from the elastomeric material for securing the elastomeric actuator to the substrate; and wherein the lower surface comprises at least first, second, and third sub-surfaces electrically coupled together, wherein the second sub-surface is formed at a first height with respect to the first sub-surface and the third sub-surface is formed at a second height with respect to the second sub-surface such that, as the increasing force is applied to the upper surface of the elastomeric actuator, each of the first, second, and third sub-surfaces successively contacts the successive portions of the resistor network, in response to which the resistance between the first and second terminals varies incrementally.

2. The variable resistor according to claim 1, wherein the resistance between the first and second terminals decreases as the increasing force is applied to the upper surface of the elastomeric actuator.

3. An electronic device comprising:

a power source for providing power;

a variable resistor for varying a resistance between a first terminal coupled to the power source and a second terminal, the variable resistor comprising:

a substrate having formed thereon a resistor network for providing the resistance, wherein the resistor network is electrically coupled between the first and second terminals; and an elastomeric actuator formed from an elastomeric material and having opposing upper and lower surfaces, wherein the lower surface is conductive, and wherein the lower surface electrically couples the first terminal to successive portions of the resistor network as an increasing force is applied to the upper surface of the elastomeric actuator, in response to which the resistance between the first and second terminals varies, and in response to which the power provided at the second terminal varies, wherein the elastomeric actuator further includes integral attachment means formed from the elastomeric material for securing the elastomeric actuator to the substrate;

wherein the lower surface comprises at least first, second, and third sub-surfaces electrically coupled together, wherein the second sub-surface is formed at a first height with respect to the first sub-surface and the third sub-surface is formed at a second height with respect to the second sub-surface such that, as the increasing force is applied to the upper surface of the elastomeric actuator, each of the first, second, and third sub-surfaces successively contacts the successive portions of the resistor network, in response to which the resistance between the first and second terminals varies incrementally; and sensing circuitry coupled to the second terminal for sensing the power provided at the second terminal and for performing a predetermined action in response thereto.

4. The electronic device according to claim 3, wherein the resistance between the first and second terminals decreases as the increasing force is applied to the upper surface of the elastomeric actuator.

5. The electronic device according to claim 4, wherein:

the power source comprises a voltage source for providing a voltage at the first terminal such that a current provided at the second terminal increases as the increasing force is applied to the upper surface of the elastomeric actuator; and the sensing circuitry senses the current provided at the second terminal.

6. The electronic device according to claim 5, wherein the sensing circuitry comprises an electroluminescent panel which emits increasing amounts of light for backlighting a display as the current provided at the second terminal increases.

7. The electronic device according to claim 5, wherein the sensing circuitry comprises an amplifier for increasing the volume of a transducer coupled thereto as the current provided at the second terminal increases.

8. A radio communication device having a receiver for receiving a selective call message and Generating therefrom an audio signal, the radio communication device comprising:

an amplifier coupled to the receiver for amplifying the audio signal;

a transducer coupled to the amplifier for receiving the audio signal and generating therefrom a voice message for presentation thereby;

a variable resistor coupled between the receiver and the amplifier for varying a resistance between first and second terminals in response to which the volume of the transducer varies, wherein the first terminal is coupled to the receiver and the second terminal is coupled to the amplifier, the variable resistor comprising:

a substrate having formed thereon a resistor network for providing the resistance, wherein the resistor network is electrically coupled between the first and second terminals; and an elastomeric actuator formed from an elastomeric material and having opposing upper and lower surfaces, wherein the lower surface is conductive, and wherein the lower surface electrically couples the first terminal to successive portions of the resistor network as an increasing force is applied to the upper surface of the elastomeric actuator, in response to which the resistance between the first and second terminals varies, and in response to which a volume at which the transducer presents the voice message varies, wherein the elastomeric actuator further includes integral attachment means formed from the elastomeric material for securing the elastomeric actuator to the substrate;

wherein the lower surface comprises at least first, second, and third sub-surfaces electrically coupled together, wherein the second sub-surface is formed at a first height with respect to the first sub-surface and the third sub-surface is formed at a second height with respect to the second sub-surface such that, as the increasing force is applied to the upper surface of the elastomeric actuator, each of the first, second, and third sub-surfaces successively contacts the successive portions of the resistor network, in response to which the resistance between the first and second terminal varies; and a housing for enclosing the receiver, the amplifier, and the transducer and for partially enclosing the variable resistor, wherein the housing has formed therein an opening through which a user can apply the increasing force to the upper surface of the elastomeric actuator.

9. The radio communication device according to claim 8, wherein, as the increasing force is applied to the upper surface of the elastomeric actuator, the resistance provided between the first and second terminals decreases, in response to which the volume of the transducer increases.

* * * * *